United States Patent
Kondo et al.

(10) Patent No.: US 6,462,628 B2
(45) Date of Patent: Oct. 8, 2002

(54) ISOLATOR DEVICE WITH BUILT-IN POWER AMPLIFIER AND EMBEDDED SUBSTRATE CAPACITOR

(75) Inventors: Ryoichi Kondo; Takahide Kurahashi; Shinya Nakai; Hajime Kato, all of Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 09/816,400

(22) Filed: Mar. 26, 2001

(65) Prior Publication Data

US 2001/0017576 A1 Aug. 30, 2001

Related U.S. Application Data

(63) Continuation of application No. PCT/JP00/05009, filed on Jul. 27, 2000.

(30) Foreign Application Priority Data

Jul. 29, 1999 (JP) .......................................... 11-215384

(51) Int. Cl.[7] .............................. H01P 1/36; H01P 1/383
(52) U.S. Cl. ...................................... 333/24.2; 333/1.1
(58) Field of Search ................................ 333/1.1, 24.2; H01P 1/36, 1/383

(56) References Cited

U.S. PATENT DOCUMENTS 4,792,939 A    12/1988  Hikita et al. .................. 455/86
5,945,887 A     8/1999  Makino et al. ............... 333/1.1
2001/0028280 A1 * 10/2001  Maruhashi et al. .......... 333/1.1

FOREIGN PATENT DOCUMENTS

| JP | 62-176208  | 8/1987  |
| JP | 1-179615   | 12/1989 |
| JP | 1-179619   | 12/1989 |
| JP | 4-107903   | 9/1992  |
| JP | 4-284722   | 10/1992 |
| JP | 6-268532   | 9/1994  |
| JP | 6-268533   | 9/1994  |
| JP | 7-15212    | 1/1995  |
| JP | 9-162774   | 6/1997  |
| JP | 9-270608   | 10/1997 |
| JP | 10-150305  | 6/1998  |
| JP | 10-200308  | 7/1998  |
| JP | 10-200310  | 7/1998  |
| JP | 10-327003  | 12/1998 |

* cited by examiner

Primary Examiner—Justin P. Bettendorf
(74) Attorney, Agent, or Firm—Armstrong, Westerman & Hattori, LLP

(57) ABSTRACT

An isolator device with a built-in power amplifier includes a single dielectric multi-layered substrate, a high frequency power amplifier circuit, an isolator element, and circuit elements provided to the dielectric multi-layered substrate. The high frequency power amplifier circuit and the isolator element are connected with each other through the circuit elements and united with the single dielectric multi-layered substrate.

20 Claims, 13 Drawing Sheets

ISOLATOR DEVICE WITH BUILT-IN POWER AMPLIFIER AND EMBEDDED SUBSTRATE CAPACITOR

CROSS-REFERENCES TO RELATED APPLICATIONS

This is a continuation of International Application PCT/JP00/05009, with an international filing date of Jul. 27, 2000.

FIELD OF THE INVENTION

The present invention relates to an isolator device with a high frequency power amplifier circuit and an isolator element, used in for example a transmitting section of a portable phone or a mobile communication terminal.

DESCRIPTION OF THE RELATED ART

Recently, competition for downsizing and weight reduction of communication devices such as portable phones and mobile communication terminals has become intense and thereby, requests for further decrease of parts constituting these communication devices in size, weight and thickness, quantity, and power consumption have been raised more and more.

In a communication device such as a portable phone and a mobile communication terminal, an isolator element serving as an non-reciprocal circuit element is generally connected to an output side of a high frequency power amplifier circuit in a transmitting section in order to hinder the high frequency power reflected due to conditional variations of an antenna from reaching the high frequency power amplifier circuit by an isolator element and to prevent the high frequency power amplifier circuit from deteriorating or unnecessary outputs from increasing.

A conventional high frequency power amplifier circuit is formed on a dielectric substrate as a module and mounted in a metallic case for shielding. In the case of an isolator element, on the other hand, it is necessary to cover a magnetic material with a high magnetic permeability metal because of the structure of the element. Therefore, because it is different from normal electronic circuits formed on an insulating substrate in material and structure, the isolator element is fabricated as an independent component. That is, a conventional isolator element is mounted in a metallic case separate from a high frequency power amplifier circuit.

Thus, although a high frequency power amplifier circuit and an isolator element are deeply related with each other in function, they are handled as components separate from each other until they are set in a portable phone or mobile communication terminal. That is, these high frequency power amplifier circuit and isolator element are prepared as independent components and then mounted by soldering on a motherboard constituted of a dielectric multi-layered substrate.

Since the high frequency power amplifier and the isolator element are handled as independent components, it is difficult to decrease them in size. Thus, when they are mounted on the motherboard, the thickness of the motherboard and that of the isolator element are added each other causing the total height to increase, so that it is impossible to decrease the whole high frequency-output stage in size and thickness.

Every port of an isolator element is fabricated so that its input/output impedance becomes 50Ω which is the standard transmission-line impedance but the output impedance of a high frequency power amplifier circuit is 30Ω or less. Therefore, to connect a high frequency power amplifier with an isolator element, it is necessary to use an impedance matching circuit. Such impedance matching circuit is provided by mounting chip components of L and C on a motherboard or by forming L of a copper film pattern on the surface of the motherboard. The impedance matching circuit having the above configuration also prevents the high frequency output stage from decreasing in size and thickness.

It is necessary to separately obtain such components as a high frequency power amplifier circuit and an isolator element and also to separately design an impedance-matching circuit for coupling them. Thus, it is complicated to design a communication device such as a portable phone or a mobile communication terminal and variations of individual components is to be considered. Therefore, it may not be possible to assure keeping of performance over the whole communication device.

SUMMARY OF THE INVENTION

It is therefore an object of the present invention to provide an isolator device with a built-in power amplifier making it possible to greatly decrease a high frequency output stage in size and thickness.

It is another object of the present invention to provide an isolator device with a built-in power amplifier making it possible to easily design a communication device such as a portable phone and a mobile communication terminal, and to minimize variations in performance over the whole communication device.

According to the present invention, an isolator device with a built-in power amplifier includes a single dielectric multi-layered substrate, a high frequency power amplifier circuit, an isolator element, and circuit elements provided to the dielectric multi-layered substrate. The high frequency power amplifier circuit and the isolator element are connected with each other through the circuit elements and united with the single dielectric multi-layered substrate.

As described in detail, according to the present invention, a high frequency power amplifier circuit and an isolator element are connected with each other through circuit elements provided to a single dielectric multi-layered substrate and also united with the single dielectric multi-layered substrate. Since a high frequency output stage is united with the single dielectric multi-layered substrate, it is possible to greatly decrease the high frequency output stage in size and thickness. Also, it is possible to reduce the number of components due to the unification.

The isolator device with built-in power amplifier according to the present invention has advantages of (1) reducing the mounting area of the whole high frequency output stage, (2) reducing the design labors of communication devices because a designer of the communication device such as a portable phone and a mobile communication terminal needs not to separately obtain components such as a high frequency power amplifier circuit and an isolator element or separately design an impedance matching circuit for connecting these components, and (3) minimizing the performance variations over the whole communication device.

It is preferred that at least a part of the circuit elements is embedded in the dielectric multi-layered substrate. Also, it is preferred that the circuit elements include a capacity section of the isolator element, and that the capacity section of the isolator element is embedded in the dielectric multi-layered substrate.

It is further preferred that at least a part of the circuit elements is mounted on the dielectric multi-layered substrate.

Preferably, an impedance matching circuit for matching an output impedance of the high frequency power amplifier circuit with an input impedance of the isolator element is embedded in the dielectric multi-layered substrate, or mounted on the dielectric multi-layered substrate.

It is preferred that a main part, more concretely a circulator element and center conductors, of the isolator element is integrally inserted into a fitting section formed by removing a part of the dielectric multi-layered substrate. This fitting section may be a cutout or a via hole of the dielectric multi-layered substrate. Since the main part of the isolator element is integrally inserted into the fitting section as the cutout or via hole. it is possible to unite the high frequency power amplifier circuit and the isolator element into one body without increasing the overall height, and to decrease the body in thickness.

It is preferred that the isolator element has a first port electrically connected to the high frequency power amplifier circuit through an impedance matching circuit, and that the first port has a standard transmission-line impedance.

It is also preferred that the isolator element has a first port electrically connected to the high frequency power amplifier circuit, and that the first port has an input impedance almost matched with an output impedance of the high frequency power amplifier circuit. In this case, preferably, the first port of the isolator element is electrically connected to the high frequency power amplifier circuit through an impedance matching circuit. Since the impedance of the input port of the isolator element, connected to the high frequency power amplifier circuit, is adjusted to an impedance close to the output impedance of the high frequency power amplifier circuit, the impedance-matching circuit is simplified and it can be further decreased in size.

It is preferred that the isolator element has a second port having an impedance different from the impedance of the first port. In this case, more preferably, the impedance of the first port is lower than the impedance of the second port.

The impedance of the second port may be equal to a standard transmission-line impedance.

It is preferred that the circulator element includes a magnetic material block and trigonally symmetric center conductors formed in the magnetic material block, and that a width of the center conductor connected to the first port is different from a width of the center conductors connected to other ports.

It is also preferred that the isolator element has a circulator element, an upper surface of the circulator element being in almost the same plane as an upper surface of the dielectric multi-layered substrate, and that terminal electrodes of first and second ports of the circulator element are positioned at the upper surface of the circulator element.

It is further preferred that the isolator element has a circulator element, an upper surface of the circulator element being in almost the same plane as an upper surface of the dielectric multi-layered substrate, and that terminal electrodes of first and second ports of the circulator element are positioned at the upper surface and a lower surface of the circulator element, respectively.

It is preferred that the high frequency power amplifier circuit and the isolator element are covered by a common single shielding case made of a soft magnetic material such as iron or the like, so that all functional members in the isolator device are shielded and a closed magnetic circuit is formed around the entire isolator device to completely exhibit functions of the isolator device.

It is also preferred that the device further includes an SAW (surface acoustic wave) device mounted on the dielectric multi-layered substrate and coupled to an input of the high frequency power amplifier circuit, and a matching circuit embedded in or mounted on the dielectric multi-layered substrate to match an output impedance of the SAW device with an input impedance of the high frequency power amplifier circuit.

Further objects and advantages of the present invention will be apparent from the following description of the preferred embodiments of the invention as illustrated in the accompanying drawings.

BRIEF DESCRIPTION OF THE DRAWINGS

FIG. 4b is a sectional view taken along a line B—B in FIG. 4a;

FIG. 5b is an equivalent circuit diagram of an inductor and a capacitor (capacity section) of an input port of the isolator element of the embodiment shown in FIG. 5a;

FIG. 5d is an equivalent circuit diagram of the whole isolator element of the embodiment shown in FIG. 5a;

FIG. 6a is a oblique view illustrating an appearance of the isolator device with a built-in power amplifier of the embodiment shown in FIG. 5a;

FIG. 6b is a sectional view taken along the line B—B in FIG. 6a;

FIG. 8b is a sectional view taken along the line B—B in FIG. 8a;

FIG. 13b is a sectional view taken along the line B—B in FIG. 13a; and

DESCRIPTION OF THE PREFERRED EMBODIMENTS

Figure 1:
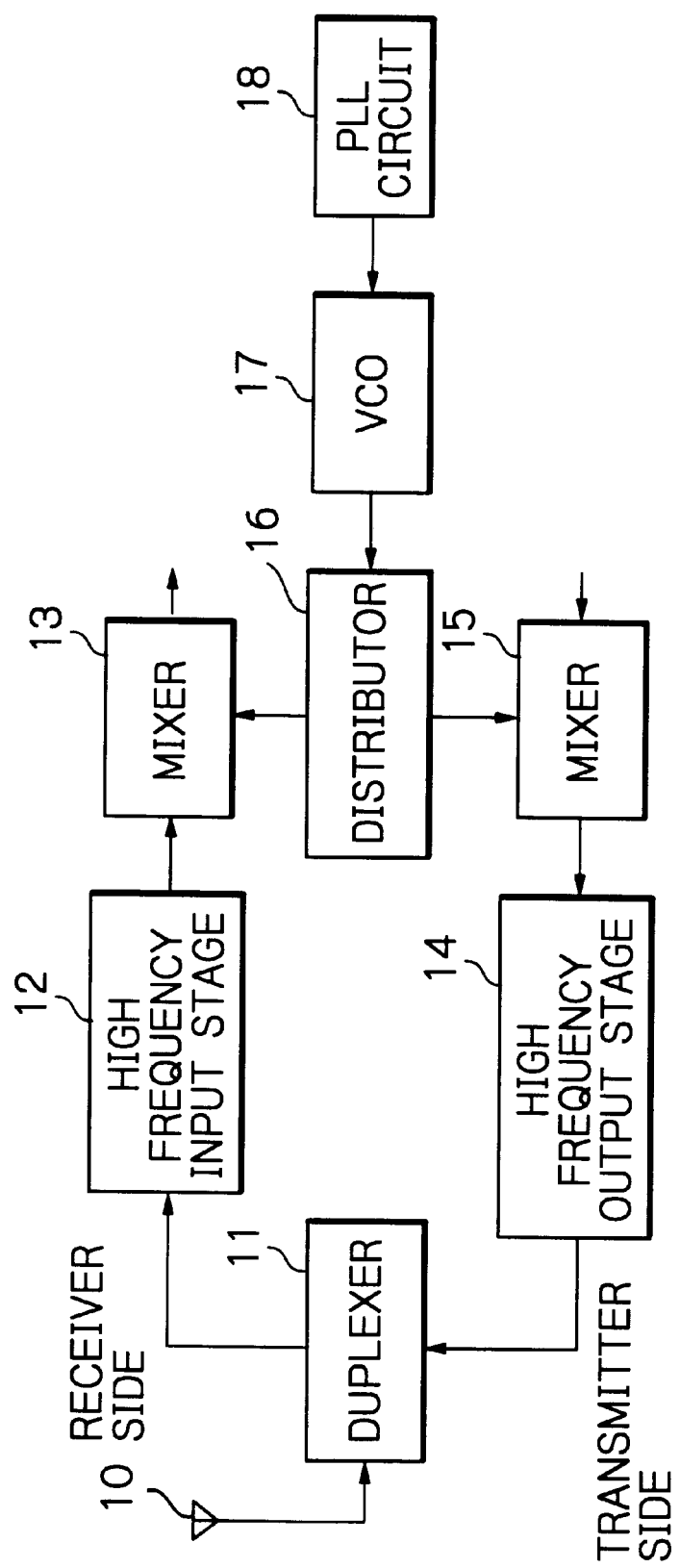
FIG. 1 is a block diagram illustrating a circuit configuration example of a communication device in which an isolator device with a built-in power amplifier of the present invention is mounted.

FIG. 1 illustrates a circuit configuration of a portable phone in which an isolator device with a built-in power amplifier according to the present invention is mounted.

In the figure, reference numeral 10 denotes an antenna, 11 a duplexer for branching transmission and reception signals, 12 a high frequency input stage at the receiver side, which has a multistage low-noise amplifier circuit and a BPF (band-pass filter), 13 a receiver-side mixer, 14 a transmitter-side high frequency output stage constituted of an isolator device with a built-in power amplifier according to the present invention, 15 a transmitter-side mixer, 16 a distributor, 17 a VCO (voltage control oscillator), and 18 a PLL (phase locked loop) circuit. The high frequency output stage 14 is constituted by the isolator device with a built-in power amplifier, and in the present invention, this isolator device is formed by an integrated single component.

Figure 2:
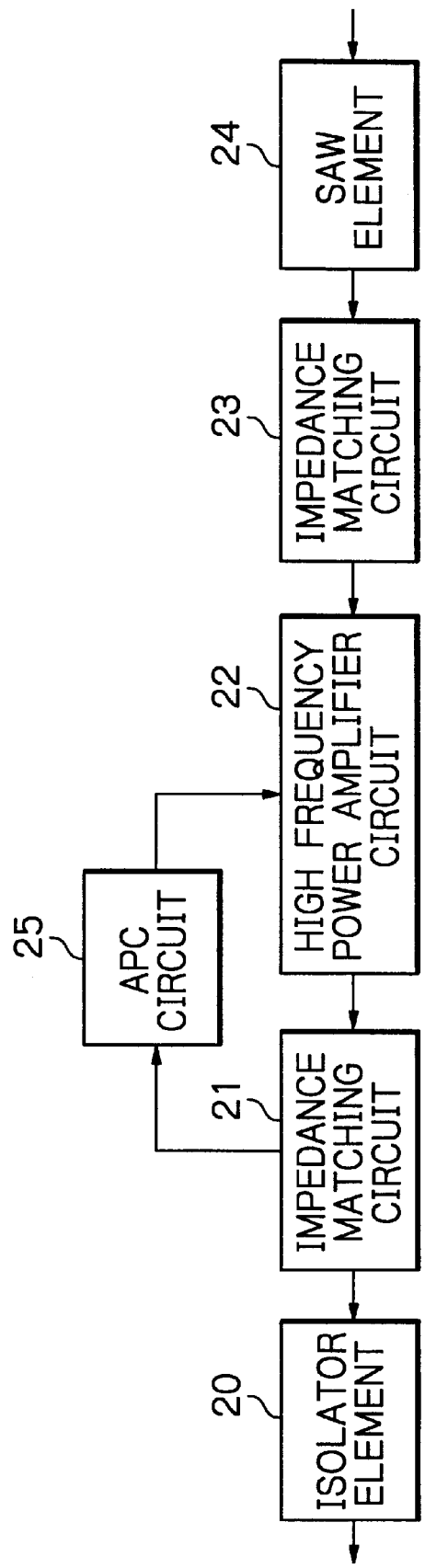
FIG. 2 is a block diagram illustrating a circuit configuration example of the integrated isolator device with a built-in power amplifier shown in FIG. 1.

FIG. 2 illustrates a circuit configuration of the integrated isolator device shown in FIG. 1. This circuit configuration corresponds to an isolator device with a built-in power amplifier in an embodiment shown in FIG. 7.

In FIG. 2, reference numeral 20 denotes an isolator element whose output terminal is connected to the duplexer 11 (FIG. 1), 21 an output-impedance matching circuit connected to the input terminal of the isolator element 20, 22 a high frequency power amplifier circuit connected to the input terminal of the isolator element 20 through the impedance matching circuit 21, 23 denotes an input-impedance matching circuit connected to the input terminal of the high frequency power amplifier circuit 22, 24 denotes a BPF constituted by a SAW (surface acoustic wave) element connected to the input terminal of the high frequency power amplifier circuit 22 through the impedance matching circuit 23, and 25 denotes an APC (automatic transmission power control) circuit serving as feedback means connected to the high frequency power amplifier circuit 22 from the impedance matching circuit 21 to control outputs of the high frequency power amplifier circuit 22.

The isolator element 20 is an non-reciprocal circuit element whose transfer characteristics are changed, by applying a high frequency signal to its ferrite block to which a DC static magnetic field is applied, depending on the transfer direction of the signal. In order to reduce the influence due to the load-conditional variations of the high frequency power amplifier circuit 22, this isolator element 20 is connected between the high frequency power amplifier circuit 22 and the antenna-side duplexer 11. Also, in order to match the impedance of the high frequency power amplifier circuit 22 with that of the isolator element 20, the output-impedance matching circuit 21 is connected between the circuit 22 and the element 20.

Figure 3:
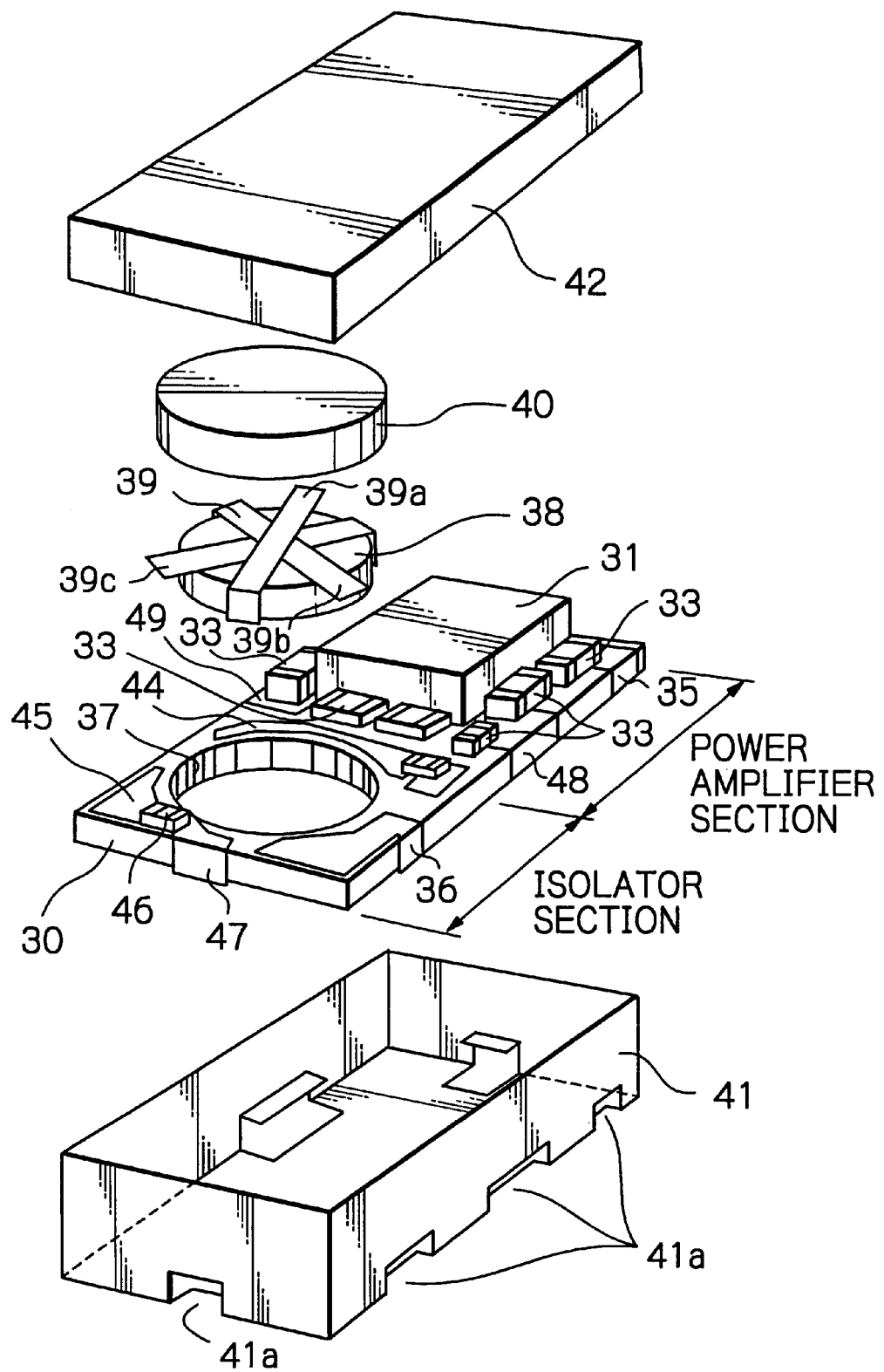
FIG. 3 is an exploded oblique view schematically illustrating a structure of an isolator device with a built-in power amplifier in a preferred embodiment of the present invention.
Figure 4A:
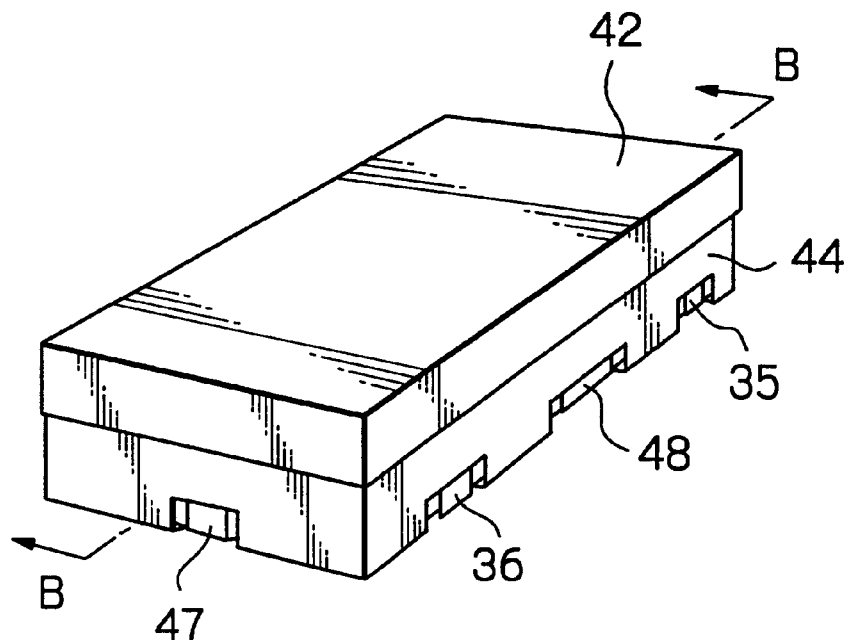
FIG. 4a is a oblique view illustrating an appearance of the isolator device with a built-in power amplifier in the embodiment shown in FIG. 3.
Figure 4B:
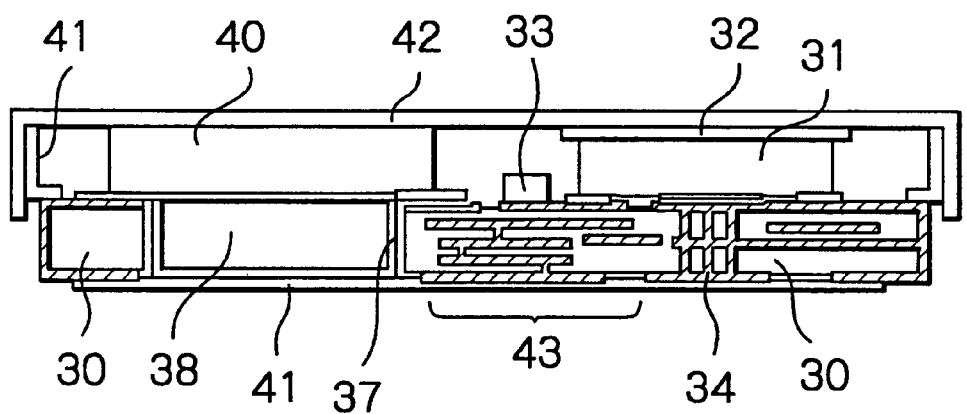

FIG. 3 schematically illustrates the structure of the isolator device with a built-in power amplifier in a preferred embodiment of the present invention, FIG. 4a illustrates the appearance of the isolator device in the embodiment shown in FIG. 3, and FIG. 4b illustrates a B—B line section of FIG. 4a.

In these figures, reference numeral 30 denotes a single dielectric multi-layered substrate, 31 a power amplifier MMIC (monolithic microwave integrated circuit) chip mounted on the substrate 30 to constitute a main portion of the high frequency power amplifier circuit, 32 a heat-radiation spacer for the power amplifier MMIC chip 31, 33 a plurality of chip components mounted also on the substrate 30, 34 an internal connection conductor for the high frequency power amplifier circuit formed in the substrate 30, 35 an input terminal electrode of this isolator device, 36 an output terminal electrode of the isolator device, 37 a circular via hole of the substrate 30, 38 a circular circulator element for the isolator element, inserted into the via hole 37, 39 center conductors wound around the circulator element 38, 40 a circular permanent magnet, 41 a metallic case member made of a soft magnetic material and provided with a plurality of windows 41a so as not to contact with terminal electrodes, 42 a lid member made of a soft magnetic material to cover the whole isolator device in corporation with the metallic case member 41, 43 an output-impedance matching circuit consisting of electrodes, dielectrics and conductor patterns formed in the dielectric multi-layered substrate 30 to match the impedance between the power amplifier MMIC chip 31 and the isolator element, 44 an output electrode of the output-impedance matching circuit 43 connected to an input port 39a of the isolator element, 45 an electrode grounded through a terminating resistor 46, and 47 to 49 ground terminal electrodes, respectively.

The input port 39a, an output port 39b and a dummy port 39c of the isolator element are formed on the upper surface of the circulator element 38, and these ports and the output terminal electrode 36, output electrode 44 and electrode 45 formed on the upper surface of the substrate 30 are connected each other on almost the same plane.

The circulator element 38 formed by the ferrite block with the center conductors 39 is inserted into the via hole 36 of the substrate 30. The capacity section of the isolator element, namely capacitor in parallel with an inductor L of the circulator element 38 to constitute a resonator, is built in the substrate 30. Since the circulator element 38 is not mounted on the substrate 30 but a part of the circulator element 38 is fitted into the via hole 36 and the capacity section of the isolator element is built in the substrate 30, it is possible to prevent the overall height of the isolator device from increasing. That is, it is possible to decrease the isolator device in thickness. Also, since the power amplifier MMIC chip 31 is connected with the input port 39a of the isolator element through the output-impedance matching circuit 43 that is constituted by electrodes, dielectrics and conductor patterns formed in the substrate 30, the high frequency output stage that is mainly constituted by the high frequency power amplifier circuit and the isolator element is integrated to the single dielectric multi-layered substrate 30, so that it is possible to greatly downsize the isolator device. It is a matter of course that the number of components of the communication device can be decreased by using the above integrated high frequency output stage.

In this connection, the isolator device in this embodiment has a mounting area of about 40 mm$^2$ and a mounting height of up to 2 mm.

Therefore, by using the isolator device in this embodiment, it is possible to reduce the mounting area of the whole high frequency output stage, to reduce the thickness of the stage, to reduce the design labors of communication devices such as portable phones and mobile communication terminals, and moreover to minimize the performance variations over the whole communication device.

Figure 5A:
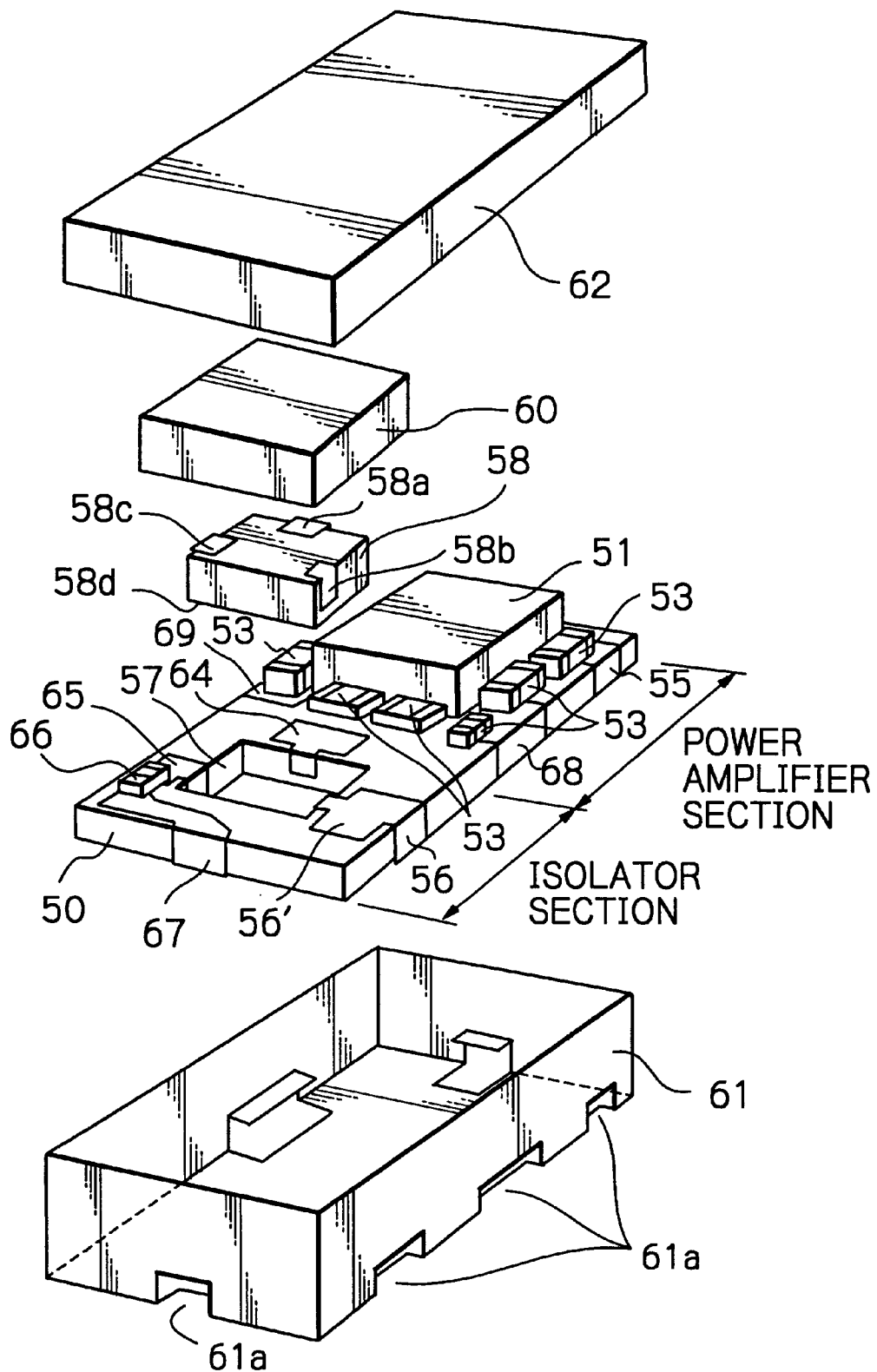
FIG. 5a is an exploded oblique view schematically illustrating a structure of an isolator device with a built-in power amplifier in another embodiment of the present invention.
Figure 5B:
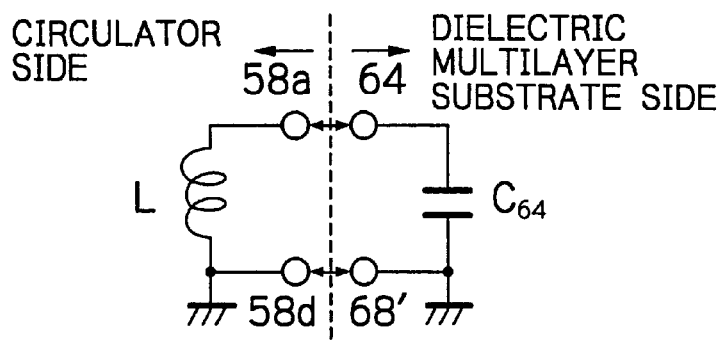
Figure 5C:
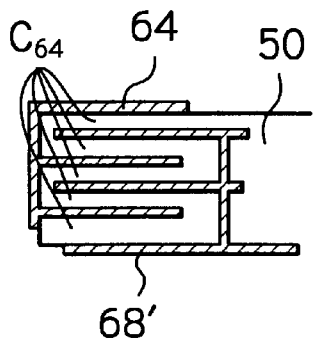
FIG. 5c is a sectional view illustrating a structure of the capacitor section of the input port of the isolator element of the embodiment shown in FIG. 5a formed on a dielectric multi-layered substrate.
Figure 5D:
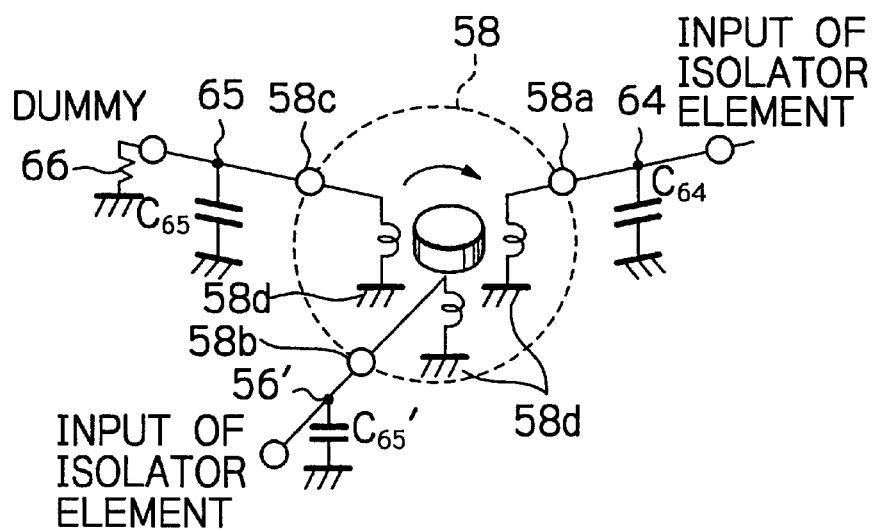
Figure 6A:
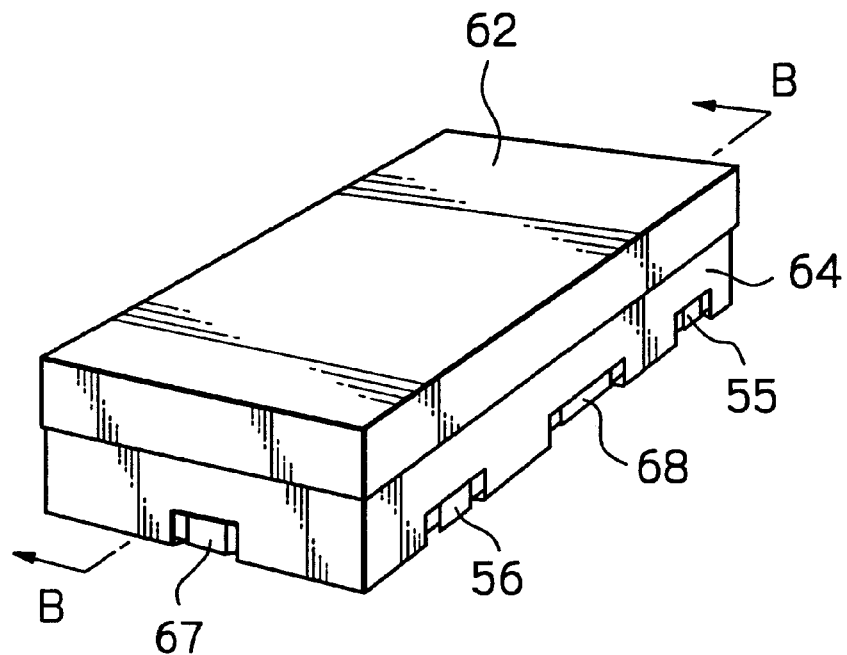
Figure 6B:
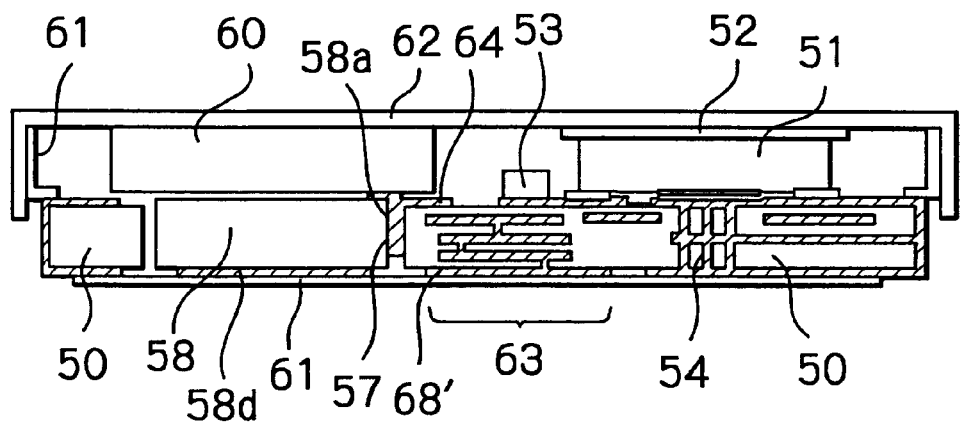

FIG. 5a schematically illustrates a structure of an isolator device with a built-in power amplifier in another embodiment of the present invention, FIG. 5b illustrates an equivalent circuit of an inductor and a capacitor (capacity section) of the input port of the isolator element in this embodiment, FIG. 5c illustrates a structure of the capacity section, formed in a dielectric multi-layered substrate, of the input port of the isolator element in this embodiment, FIG. 5d illustrates an equivalent circuit of the whole isolator element in this embodiment, FIG. 6a illustrates the appearance of the isolator device in this embodiment, and FIG. 6b illustrates a B—B line section of FIG. 6a.

In these figures, reference numeral 50 denotes a single dielectric multi-layered substrate, 51 a power amplifier MMIC chip mounted on the substrate 50 to constitute a main portion of a high frequency power amplifier circuit, 52 a heat-radiation spacer for the power amplifier MMIC chip 51, 53 a plurality of chip components also mounted on the substrate 50, 54 an internal connection conductor for the high frequency power amplifier circuit formed in the substrate 50, 55 an input terminal electrode of this isolator device, 56 an output terminal electrode of the isolator device, 57 a rectangular via hole of the substrate 50, 58 a rectangular circulator element for the isolator element, inserted into the via hole 57, 60 a rectangular permanent magnet, 61 a metallic case member made of a soft magnetic material and provided with a plurality of windows 61a so as not to contact with terminal electrodes, 62 a lid member made of a soft magnetic material to cover the whole isolator device in corporation with the metallic case member 61, 63 an output-impedance matching circuit consisting of electrodes, dielectrics and conductor patterns formed in the dielectric multi-layered substrate 50 to match the impedance between the power amplifier MMIC chip 51 and the isolator element, 64 an output electrode of the output-impedance matching circuit 63 connected to an input port 58a of the isolator element, 65 an electrode grounded through a terminating resistor 66, and 67 to 69 ground terminal electrodes, respectively.

As shown in FIGS. 5b to 5d, three resonation capacitors C (capacity sections) connected with three respective inductors L in parallel and constituted in the circulator element 58 are formed in the dielectric multi-layered substrate 50. That is, these capacitors are constituted by the electrodes 64, 56' and 65 on the surface of the substrate 50, by dielectrics and by internal electrodes in the substrate 50. For example, as shown in FIGS. 5b and 5c, a matching capacitor $C_{64}$ at the input port 58a of the isolator element is constituted by a five layer capacitor in the substrate 50. The input port 58a at the circulator element side and the electrode 64 on the surface of the substrate 50 illustrated in FIG. 5b, and also the ground electrode 58d at the circulator element side and the ground electrode 68' on the substrate 50 are electrically connected each other by soldering for example.

The input port 58a, the output port 58b and the dummy port 58c of the isolator element are provided on the upper surface and side surface of the circulator element 58. These ports are connected with the output electrode 64, the output terminal electrode 56' and the electrode 65 respectively formed on the upper surface of the substrate 50 and on the inner surface of the via hole 57. The ground electrode 58d is formed almost over the entire bottom surface of the circulator element 58.

The circulator element 58 formed by the ferrite block with center conductors is inserted into the via hole 56 of the substrate 50. Since the circulator element 58 is not mounted on the substrate 50 but a part of the circulator element 58 is fitted into the via hole 56, it is possible to prevent the overall height of the isolator device from increasing. That is, it is possible to further decrease the thickness of the isolator device.

In the conventional isolator device, the isolator element itself is enclosed by a shielding case to be used independently, and both the shielded isolator element and the power amplifier MMIC chip incorporated with the isolator element are enclosed by another shielding case. Whereas in this embodiment, the isolator element with no shielding case and the power amplifier MMIC chip are united into one body and then enclosed by a shielding case. Thus, this embodiment can achieve further decreasing in thickness. The shielding case in this embodiment is made of a soft magnetic material such as iron and also serves as a part of a closed magnetic circuit passing through the circulator element in the isolator element.

Also, since the power amplifier MMIC chip 51 is connected with the input port of the isolator element through the output-impedance matching circuit 63 that is constituted by electrodes, dielectrics and conductor patterns formed in the substrate 50, the high frequency output stage that is mainly constituted by the high frequency power amplifier circuit and the isolator element is integrated to the single dielectric multi-layered substrate 50, so that it is possible to greatly downsize the isolator device.

In this connection, the isolator device in this embodiment has a mounting area of about 40 mm$^2$ and a mounting height of up to 2 mm.

Therefore, by using the isolator device in this embodiment, it is possible to reduce the mounting area of the whole high frequency output stage, to reduce the thickness of the stage, to reduce the design labors of communication devices such as portable phones and mobile communication terminals, and moreover to minimize the performance variations over the whole communication device.

Figure 7:
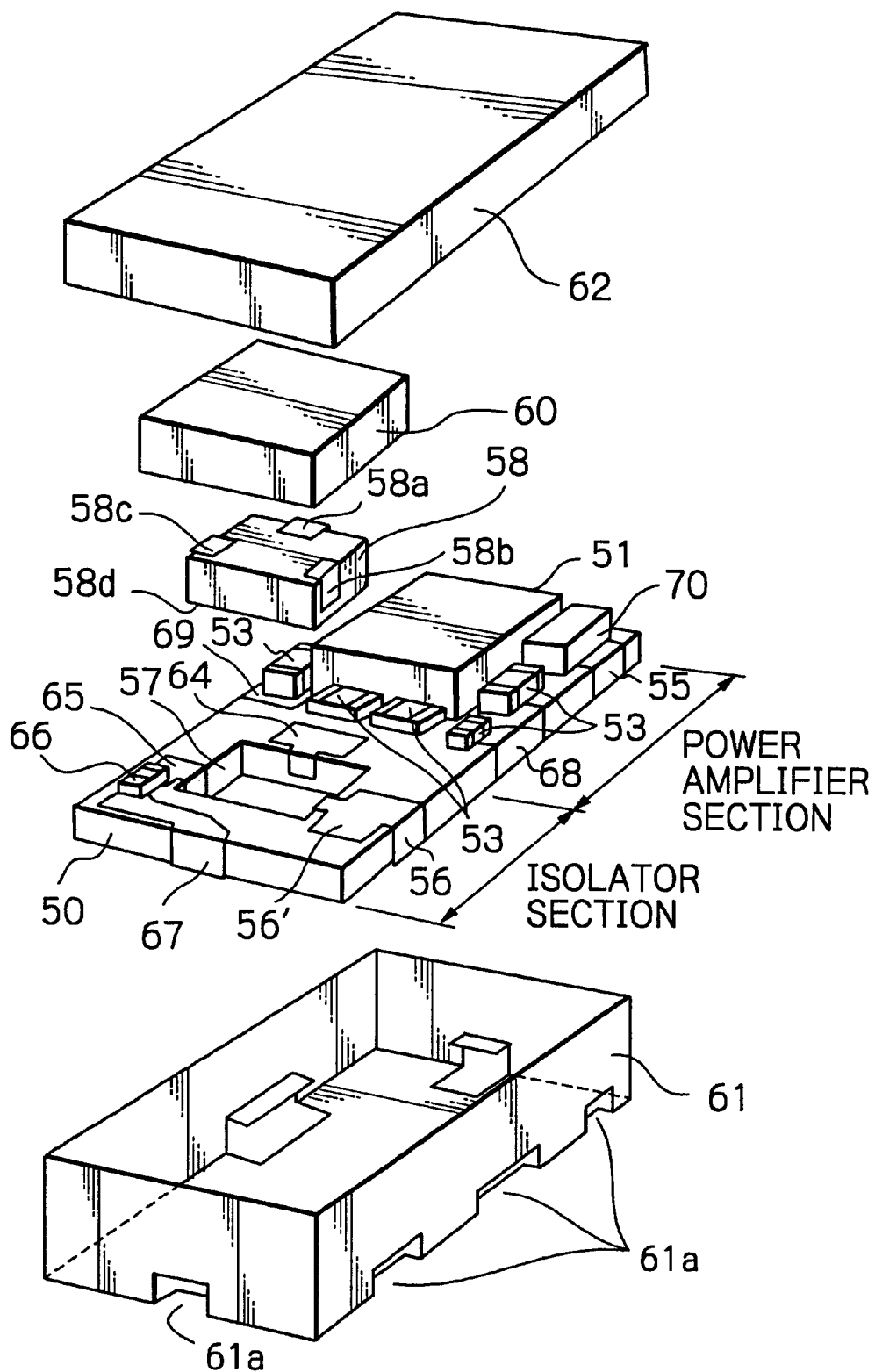
FIG. 7 is an exploded oblique view schematically illustrating a structure of an isolator device with a built-in power amplifier in a further embodiment of the present invention.

FIG. 7 schematically illustrates a structure of an isolator device with a built-in power amplifier in a further embodiment of the present invention.

In this embodiment, a BPF formed by a SAW element 70 connected to the input side of the power amplifier MMIC chip 51 of the embodiment shown in FIG. 5a through an input-impedance matching circuit not shown in FIG. 7 is integrally mounted in the isolator device. The input-impedance matching circuit is constituted by, for example, a C-L-C or L-C-L π-type or T-type circuit and formed in the substrate 50 with conductors and dielectrics. As described above, the isolator device in this embodiment has the same circuit configuration as shown in FIG. 2.

Other configurations of this embodiment are completely the same as that in the embodiment shown in FIG. 5a. Therefore, in FIG. 7, the same reference numerals are used for the same components as these in FIG. 5a. Furthermore, operations and advantages of this embodiment are the same as these of the embodiment shown in FIG. 5a.

Figure 8A:
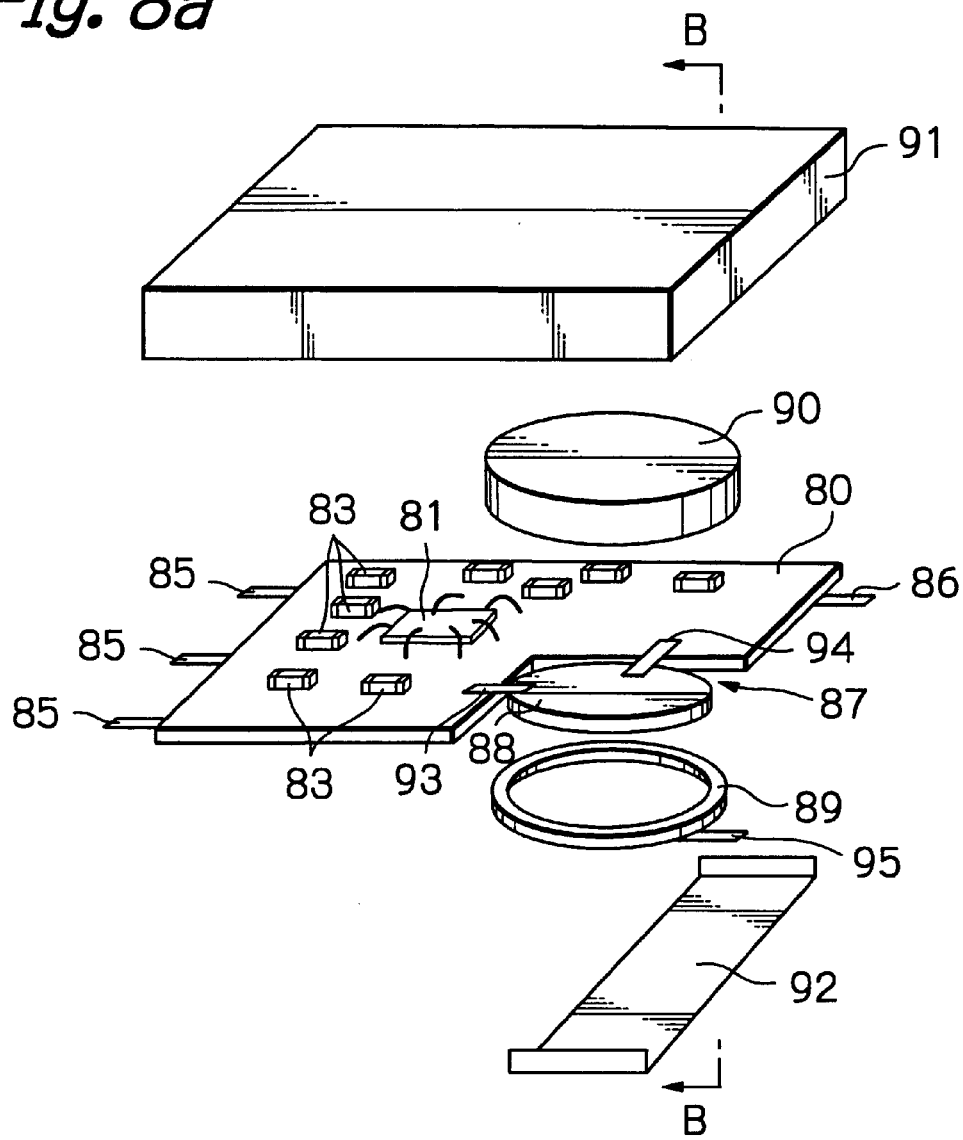
FIG. 8a is an exploded oblique view schematically illustrating a structure of an isolator device with a built-in power amplifier in a still further embodiment of the present invention.
Figure 8B:
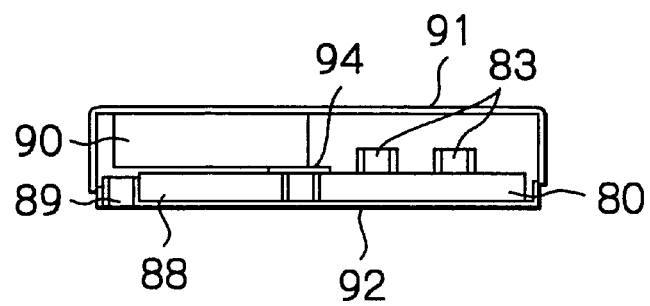

FIG. 8a schematically illustrates a structure of an isolator device with a built-in power amplifier in a still further embodiment of the present invention, and FIG. 8b illustrates a B—B line section of FIG. 8a.

In these figures, reference numeral 80 denotes a single dielectric multi-layered substrate, 81 a power amplifier MMIC chip mounted on the substrate 80 to constitute a main portion of a high frequency power amplifier circuit, 83 a plurality of chip components mounted also on the substrate 80, 85 and 86 external connection terminal electrodes including input terminal electrodes and an output terminal electrode of the isolator device, 87 a cutout of the substrate 80, 88 a circular circulator element for the isolator element, inserted into the cutout 87, 89 a spacer of the circulator element 88, 90 a circular permanent magnet, 91 a metallic case member made of a soft magnetic material to cover the whole isolator device, 92 a yoke metallic plate made of a soft magnetic material, and 93, 94 and 95 connection conductors connected to ports of the isolator element, respectively.

The cutout 87 capable of accommodating the circulator element 88 mainly constituted by the ferrite block with center conductors is formed at an end of the substrate 80. The circulator element 88 is inserted into the cutout 87 together with the position-control spacer 89. Since the circulator element 88 is not mounted on the substrate 80 but it is fitted into the cutout 87, it is possible to prevent the overall height of the isolator device from increasing. That is, it is possible to decrease the isolator device in thickness.

The output electrode of the power amplifier MMIC chip 81 is connected to an input port formed on the upper surface of the circulator element 88 through an output-impedance matching circuit (not shown) and also through the ribbon-shaped connection conductor 93. An output port 88b of the circulator element 88 is connected to the connection conductor 95 at the lower surface of the element 88. The connection conductor 95 will be connected with a printed circuit board coupled to an antenna circuit.

The output-impedance matching circuit may be formed by conductors and dielectrics in the substrate 80 as the case of the embodiments shown in FIGS. 3, 5a and 7, or formed by the chip components 83 mounted on the top surface of the substrate 80.

Figure 9:
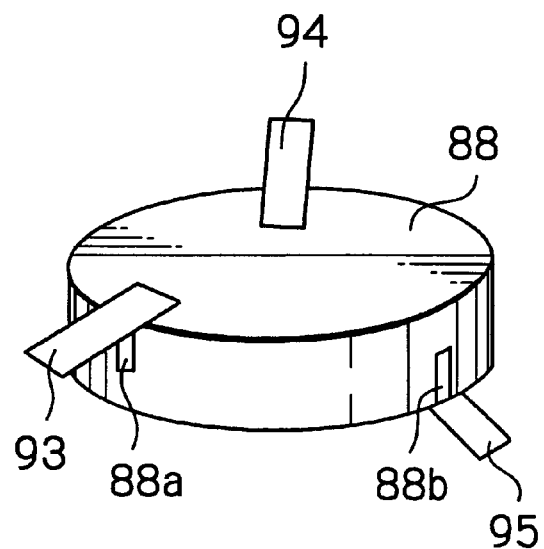
FIG. 9 is a oblique view for illustrating connecting positions of the input/output ports of the circulator element with the connection conductors in the embodiment shown in FIGS. 8a and 8b.

FIG. 9 illustrates connecting positions of the input/output ports of the circulator element with the connection conductors in this embodiment.

As shown in the figure, the input port 88a for receiving high frequency power and the dummy port among a plurality of ports of the circulator element 88 are connected with the connection conductors 93 and 94 at the upper surface (surface contacting with the exciting permanent magnet 90) of the circulator element 88, whereas the output port 88b for sending high frequency power is connected with the connection conductor 95 at the lower surface of the circulator element 88.

As aforementioned, in this embodiment, the circulator element 88 is arranged closely to the dielectric multi-layered substrate 80 and a conductor connected to the power amplifier MMIC chip 81 through the output-impedance matching circuit is formed on the upper surface of the substrate 80. Also, the input port 88a formed on the upper surface of the circulator element 88, which upper surface is in almost the same plane as the upper surface of the substrate 80, is connected to the above-mentioned conductor through the connection conductor 93, and the output port 88b of the circulator element 88 is connected to a conductor of the printed circuit board from the lower surface of the circulator element 88 through the connection conductor 95.

Although, in this embodiment, the ribbon-shaped connection conductor is used for the connection with each port of the circulator element 88, another connection means such as a flexible printed circuit board may be utilized.

The exciting permanent magnet 90 is mounted on the circulator element 88. The whole isolator device is covered by the metallic case member 91 with a high magnetic permeability and the yoke metallic plate 92 with a high magnetic permeability is attached to the lower surface of the isolator device so that a closed magnetic circuit is formed by the case member 91 and the plate 92.

Thus, according to this embodiment, it is possible to decrease the isolator device in size by uniting the high frequency power amplifier circuit and the isolator element into one body without greatly changing the thickness of the isolator device.

In this embodiment, the metallic case member 91 constituting the closed magnetic circuit also serves as a shielding case of the power amplifier MMIC chip 81. However, it is possible to enclose only the isolator element with a metal case with a high magnetic permeability and to provide separately another shielding case for the power amplifier MMC chip 81.

Other configurations of this embodiment are almost the same as these in the embodiments shown in FIGS. 3, 5a and 7. Also, operations and advantages of this embodiment are the same as these of the embodiments shown in FIGS. 3, 5a and 7.

In the above-described embodiments, impedances of all ports of each circulator element are equally designed as 50Ω. However, to simplify or to omit the configuration of the output-impedance matching circuit, it is possible to set the impedance of an input port for receiving the high frequency power of the circulator element to 30Ω or less, specifically to 25Ω, and to set the impedance of the output port 88b at the antenna side to 50Ω which is equal to the normal transmission-line impedance.

Figure 10:
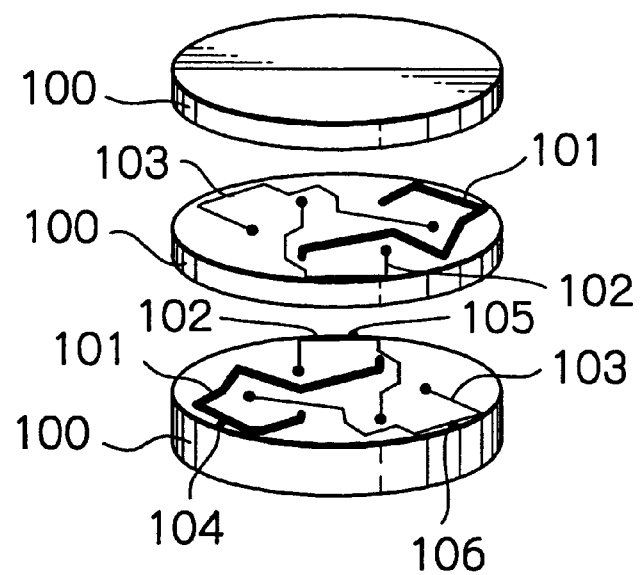
FIG. 10 is an exploded oblique view for explaining an internal structure of a circulator element as a modification of the present invention.

FIG. 10 illustrates an internal structure of a circulator element for obtaining the above impedance configuration as a modification of the present invention.

As shown in the figure, the circulator element has center conductors 101, 102 and 103, formed in a ferrite block 100, with a trigonally symmetric pattern connected with each other by via hole conductors.

The width of the center conductor 101 connected to an input port 104 at the high frequency power amplifier circuit side is set to a value larger than the width of the center c onductors 102 and 103 connected to other ports 105 and 106 so that the impedance of the port 104 becomes 25Ω. The impedance of other ports 105 and 106 is set to 50Ω. By thus making impedances of the isolator element asymmetric, it is possible to provide an impedance-conversion function in addition to its non-reciprocal function of power transmission direction.

Figure 11:
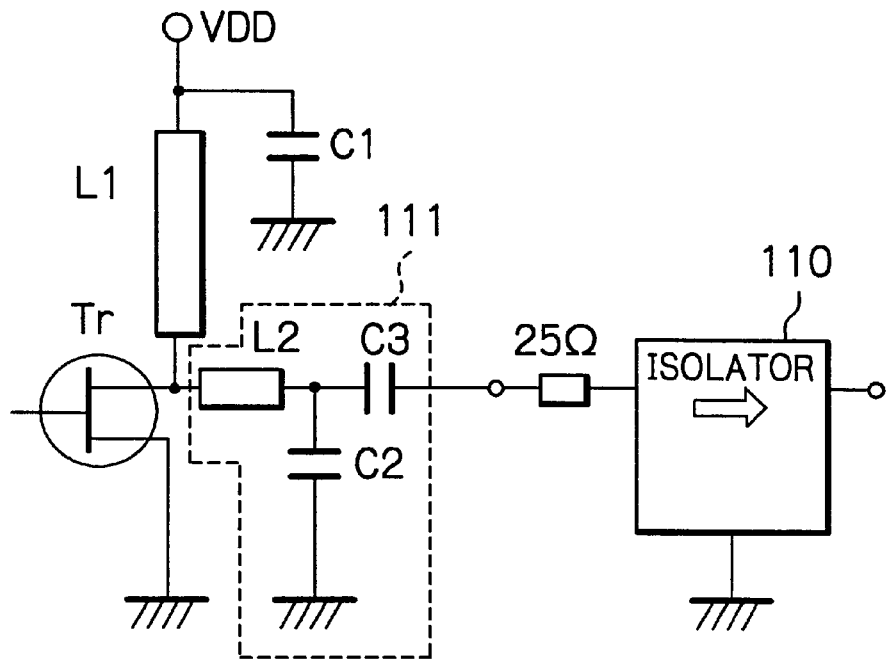
FIG. 11 is a circuit diagram illustrating a configuration of a final-stage output transistor of a high frequency power amplifier circuit and downward circuit thereof in the modification in FIG. 10.
Figure 12:
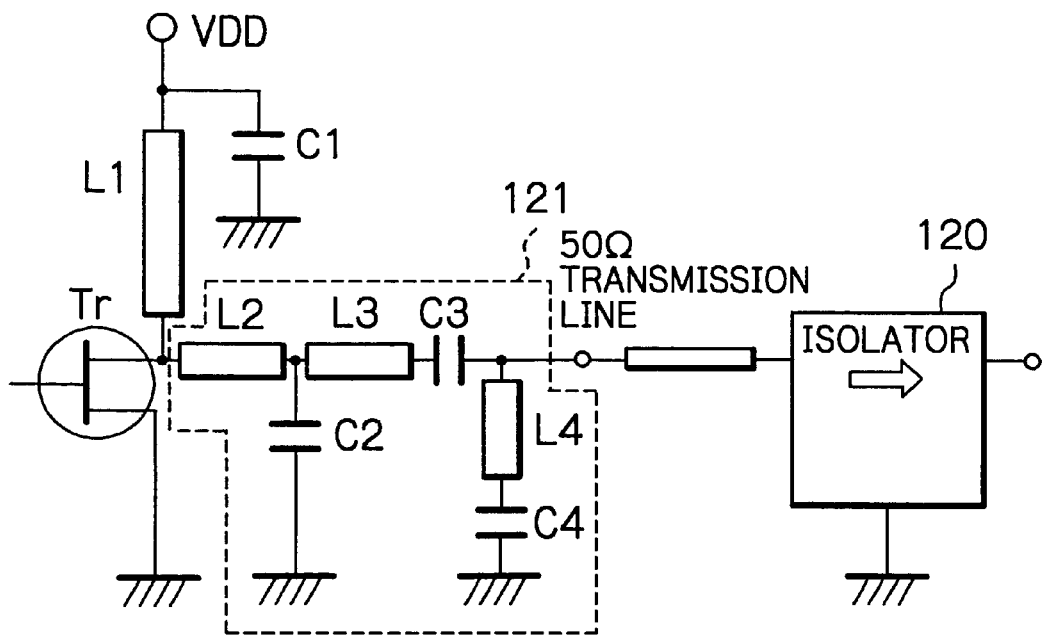
FIG. 12 is a circuit diagram illustrating a configuration of a final-stage output transistor of a conventional high frequency power amplifier and downward circuit thereof.

FIG. 11 illustrates a circuit configuration of a final-stage output transistor of a high frequency power amplifier circuit and downward circuit thereof connected to a port with an impedance of 25Ω, and FIG. 12 illustrates a circuit configuration of a final-stage output transistor of a conventional high frequency power amplifier circuit and downward circuit thereof connected to a port with an impedance of 50Ω as a comparative example.

In these figures, reference mark Tr denotes a final-stage output transistor of the high frequency amplifier circuit, 110 and 120 isolator elements, 111 and 121 impedance matching circuits, C1 to C4 capacitors and L1 to L4 inductors formed by microstrip conductors, respectively.

As will be apparent from these figures, since the output impedance of a high frequency power amplifier circuit is 30Ω or less in general, the scale of the output-impedance matching circuit is considerably decreased in case the circuit is connected to a 25Ω port as compared with the case connected to a 50Ω port. Particularly, since only a small number of inductors each occupying greatly large area is required, it is possible to greatly downsize the output-impedance matching circuit. In this connection, the output-impedance matching circuit shown in FIG. 11 is remarkably decreased in size as that a pattern-area on the substrate with respect to the circuit shown in FIG. 11 is about 40% of that of the circuit shown in FIG. 12.

The output impedance of the output transistor used in the high frequency power amplifier circuit shown in FIG. 11 is about 18Ω, and this amplifier circuit is connected to the matching circuit which will operate as an impedance converter at a purposed frequency and operates as a low-pass filter at a frequency higher than the purposed frequency. If the impedance of the isolator element is set completely equal to that of the output transistor, it is possible to omit such output-impedance matching circuit. In fact, however, it is preferable to use a matching circuit for performing the above operations in order to absorb the characteristic variations of an output transistor and to prevent abnormal oscillation.

Figure 13A:
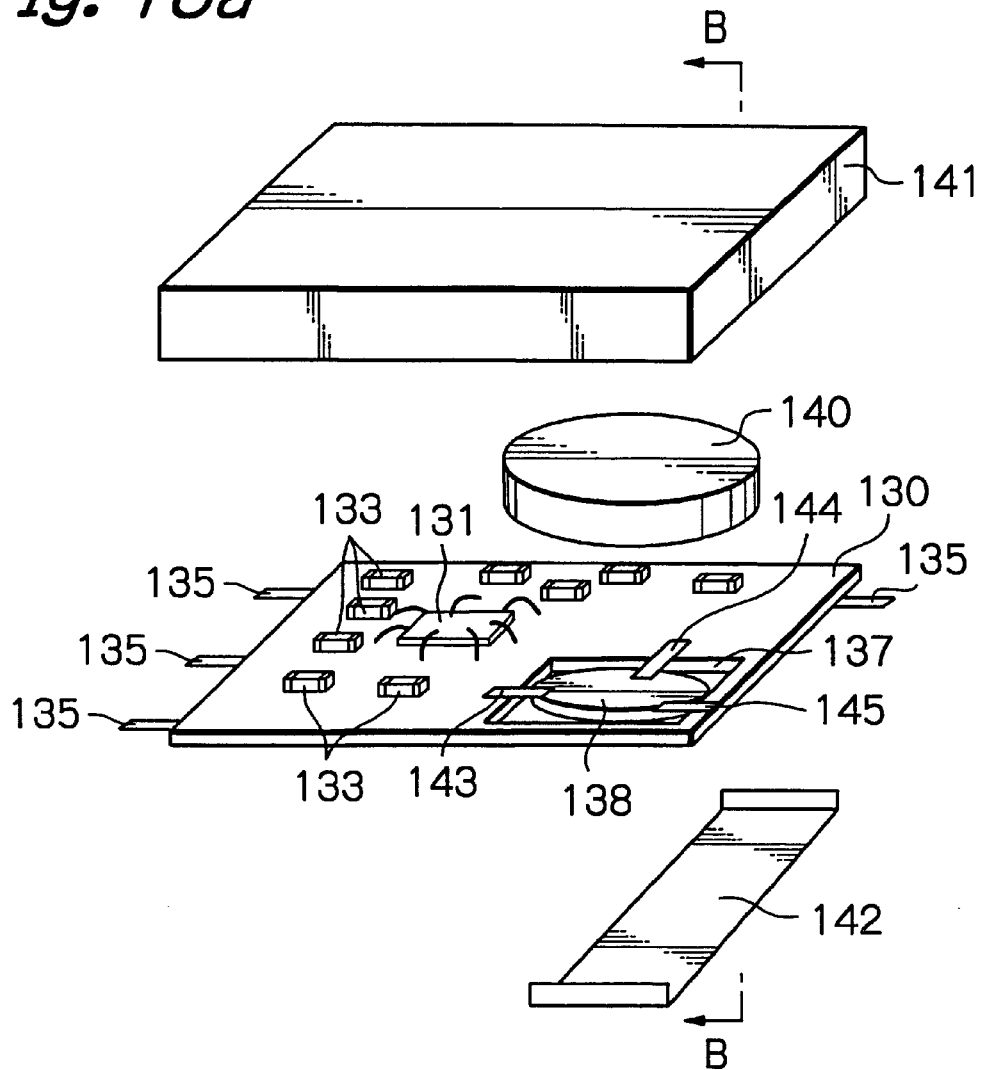
FIG. 13a is an exploded oblique view schematically illustrating a structure of an isolator device with a built-in power amplifier in a further embodiment of the present invention.
Figure 13B:
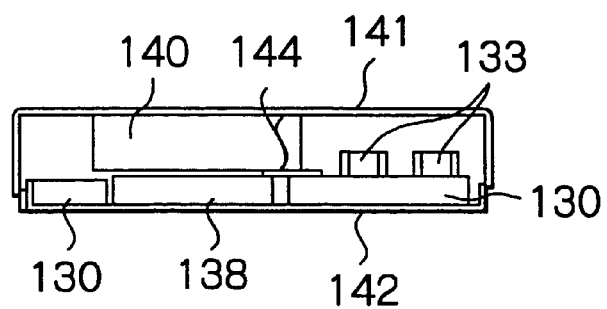

FIG. 13a schematically illustrates a structure of an isolator device with a built-in power amplifier in a further embodiment of the present invention, and FIG. 13b illustrates a B—B line section of FIG. 13a.

In these figures, reference numeral 130 denotes a single dielectric multi-layered substrate, 131 a power amplifier MMIC chip mounted on the substrate 130 to constitute a main portion of a high frequency power amplifier circuit, 133 a plurality of chip components mounted also on the substrate 130, 135 and 136 external connection terminal electrodes including input terminal electrodes and an output terminal electrode of the isolator device, 137 a rectangular via hole of the substrate 130, 138 a circular circulator element for the isolator element, inserted into the via hole 137, 140 a circular permanent magnet, 141 a metallic case member made of a soft magnetic material to cover the whole isolator device, 142 a yoke metallic plate made of a soft magnetic material, and 143, 144 and 145 connection conductors connected to ports of the isolator element, respectively.

The via hole 137 capable of accommodating the circulator element 138 mainly constituted by the ferrite block with center conductors is formed in the substrate 130, and the circulator element 138 is inserted into this via hole 137. Since the circulator element 138 is not mounted on the substrate 130 but it is inserted into the via hole 137, it is possible to prevent the overall height of the isolator device from increasing. That is, it is possible to decrease the isolator device in thickness.

The output electrode of the power amplifier MMIC chip 131 is connected to an input port formed on the upper surface of the circulator element 138 through an output-impedance matching circuit (not shown) and also through the ribbon-shaped connection conductor 143. An output port of the circulator element 138 is also connected to the connection conductor 145 at the upper surface of the element 138. The connection conductor 145 will be connected with a printed circuit board coupled to an antenna circuit.

The output-impedance matching circuit may be formed by conductors and dielectrics in the substrate 130 as the case of the embodiments shown in FIGS. 3, 5a and 7, or formed by the chip components 133 mounted on the top surface of the substrate 130.

Figure 14:
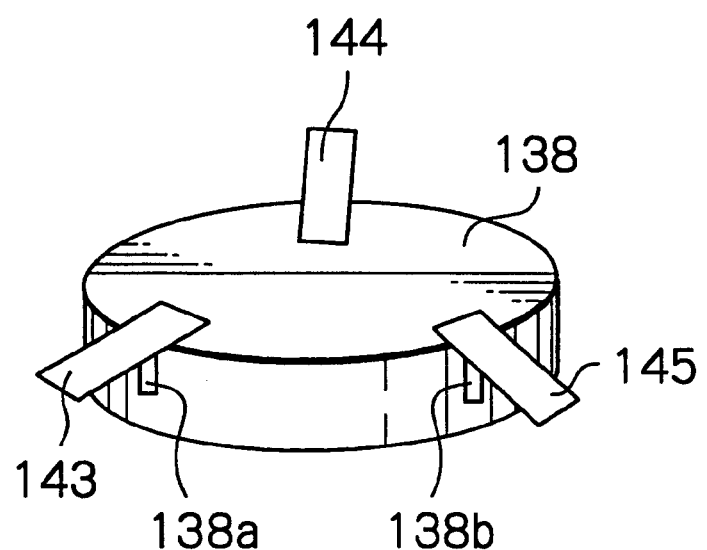
FIG. 14 is a oblique view for illustrating connecting positions of the input/output ports of the circulator element with the connection conductors in the embodiment in FIGS. 13a and 13b.

FIG. 14 illustrates connecting positions of the input/output ports of the circulator element with the connection conductors in this embodiment.

As shown in the figure, all ports of the circulator element 138 are connected with the connection conductors 143 to 145 at the upper surface (surface contacting with the exciting permanent magnet 140) of the circulator element 138.

As aforementioned, in this embodiment, the circulator element 138 is arranged closely to the dielectric multi-layered substrate 130 and a conductor connected to the power amplifier MMIC chip 131 through the output-impedance matching circuit is formed on the upper surface of the substrate 130. Also, the input port 138a formed on the upper surface of the circulator element 138, which upper surface is in almost the same plane as the upper surface of the substrate 130, is connected to the above-mentioned conductor through the connection conductor 143, and the output port 138b of the circulator element 138 is connected to a conductor of the printed circuit board also from the upper surface of the circulator element 138 through the connection conductor 145.

Although, in this embodiment, the ribbon-shaped connection conductor is used for the connection with each port of the circulator element 138, another connection means such as a flexible printed circuit board may be utilized.

The exciting permanent magnet 140 is mounted on the circulator element 138. The whole isolator device is covered by the metallic case member 141 with a high magnetic permeability and the yoke metallic plate 142 with a high magnetic permeability is attached to the lower surface of the isolator device so that a closed magnetic circuit is formed by the case member 141 and the plate 142.

Thus, according to this embodiment, it is possible to decrease the isolator device in size by uniting the high frequency power amplifier circuit and the isolator element into one body without greatly changing the thickness of the isolator device.

In this embodiment, the metallic case member 141 constituting the closed magnetic circuit also serves as a shielding case of the power amplifier MMIC chip 131. However, it is possible to enclose only the isolator element with a metal case with a high magnetic permeability and to provide separately another shielding case for the power amplifier MMC chip 131.

Other configurations of this embodiment are almost the same as these in the embodiments shown in FIGS. 3, 5a, 7 and 8a and 8b. Also, operations and advantages of this embodiment are the same as these of the embodiments shown in FIGS. 3, 5a, 7 and 8a and 8b.

In this embodiment, as well as in the modification shown in FIG. 10, it is possible to set the impedance of the input port for receiving the high frequency power of the circulator element 138 to 30Ω or less, specifically to 25Ω. and to set the impedance of the output port at the antenna side to 50Ω which is equal to the normal transmission-line impedance. The internal structure and functions and advantages of the circulator element 138 for obtaining the above impedance configuration are completely the same as those of the modification shown in FIG. 10.

As described in detail, according to the present invention, a high frequency power amplifier circuit and an isolator element are connected with each other through circuit elements provided to a single dielectric multi-layered substrate and also united with the single dielectric multi-layered substrate. Since a high frequency output stage is united with the single dielectric multi-layered substrate, it is possible to greatly decrease the high frequency output stage in size and thickness. Also, it is possible to reduce the number of components due to the unification.

The isolator device with built-in power amplifier according to the present invention has advantages of (1) reducing the mounting area of the whole high frequency output stage, (2) reducing the design labors of communication devices because a designer of the communication device such as a portable phone and a mobile communication terminal needs not to separately obtain components such as a high frequency power amplifier circuit and an isolator element or separately design an impedance matching circuit for connecting these components, and (3) minimizing the performance variations over the whole communication device.

Many widely different embodiments of the present invention may be constructed without departing from the spirit and scope of the present invention. It should be understood that the present invention is not limited to the specific embodiments described in the specification, except as defined in the appended claims.

What is claimed is:

1. An isolator device with a built-in power amplifier, comprising single dielectric multi-layered substrate, a high frequency power amplifier circuit, an isolator element, and circuit elements provided to the dielectric multi-layered substrate, said high frequency power amplifier circuit and said isolator element being connected with each other through said circuit elements, said circuit elements including a capacitor section of said isolator element, said capacitor section of said isolator element being embedded in said dielectric multi-layered substrate, said high frequency power amplifier circuit and said isolator element being united with said single dielectric multi-layered substrate which has said embedded capacitor.

2. The device as claimed in claim 1, wherein at least a part of said circuit elements is embedded in said dielectric multi-layered substrate.

3. The device as claimed in claim 1, wherein at least a part of said circuit elements is mounted on said dielectric multi-layered substrate.

4. The device as claimed in claim 1, wherein an impedance matching circuit for matching an output impedance of said high frequency power amplifier circuit with an input impedance of said isolator element is embedded in said dielectric multi-layered substrate.

5. The device as claimed in claim 1, wherein an impedance matching circuit for matching an output impedance of said high frequency power amplifier circuit with an input impedance of said isolator element is mounted on said dielectric multi-layered substrate.

6. The device as claimed in claim 1, wherein a main part of said isolator element is integrally inserted into a fitting section formed by removing a part of said dielectric multi-layered substrate.

7. The device as claimed in claim 6, wherein said fitting section is a cutout of said dielectric multi-layered substrate.

8. The device as claimed in claim 6, wherein said fitting section is a via hole of said dielectric multi-layered substrate.

9. The device as claimed in claim 1, wherein said isolator element has a first port electrically connected to said high frequency power amplifier circuit through an impedance matching circuit.

10. The device as claimed in claim 1, wherein said isolator element has a first port electrically connected to said high frequency power amplifier circuit, and wherein said first port has an input impedance almost matched with an output impedance of said high frequency power amplifier circuit.

11. The device as claimed in claim 10, wherein said first port of said isolator element is electrically connected to said high frequency power amplifier circuit through an impedance matching circuit.

12. The device as claimed in claim 10, wherein said isolator element has a second port having an impedance different from the impedance of said first port.

13. The device as claimed in claim 12, wherein the impedance of said first port is lower than the impedance of said second port.

14. The device as claimed in claim 12, wherein the impedance of said second port is equal to a transmission-line impedance.

15. The device as claimed in claim 12, wherein said circulator element includes a magnetic material block and triangularly symmetric center conductors formed in said magnetic material block, and wherein a width of said center conductor connected to said first port is different from a width of the center conductors connected to other ports.

16. The device as claimed in claim 1, wherein said isolator element has a circulator element, an upper surface of said circulator element being in almost the same plane as an upper surface of said dielectric multi-layered substrate, and wherein terminal electrodes of first and second ports of said circulator element are positioned at the upper surface of said circulator element.

17. The device as claimed in claim 1, wherein said isolator element has a circulator element, an upper surface of said circulator element being in almost the same plane as an upper surface of said dielectric multi-layered substrate, and wherein terminal electrodes of first and second ports of said circulator element are positioned at the upper surface and a lower surface of said circulator element, respectively.

18. The device as claimed in claim 1, wherein said high frequency power amplifier circuit and said isolator element are covered by a common single shielding case.

19. The device as claimed in claim 1, wherein said device further comprises an SAW device mounted on said dielectric multi-layered substrate and coupled to an input of said high frequency power amplifier circuit, and a matching circuit embedded in said dielectric multi-layered substrate to match an output impedance of said SAW device with an input impedance of said high frequency power amplifier circuit.

20. The device as claimed in claim 1, wherein said device further comprises an SAW device mounted on said dielectric multi-layered substrate and coupled to an input of said high frequency power amplifier circuit, and a matching circuit mounted on said dielectric multi-layered substrate to match an output impedance of said SAW device with an input impedance of said high frequency power amplifier circuit.

* * * * *